United States Patent [19]

Takagi et al.

[11] 4,313,169

[45] Jan. 26, 1982

[54] FAULT DETECTING SYSTEM FOR LOCATING A FAULT POINT WITH A FAULT RESISTANCE SEPARATELY MEASURED

[75] Inventors: Toshio Takagi; Yukinari Yamakoshi, both of Tokyo, Japan

[73] Assignee: Tokyo Denryoku Kabushiki Kaisha, Tokyo, Japan

[21] Appl. No.: 63,412

[22] Filed: Aug. 3, 1979

[30] Foreign Application Priority Data

Nov. 13, 1978 [JP] Japan ............................ 53-139583

[51] Int. Cl.³ ...................... G01R 31/08; G06F 15/56
[52] U.S. Cl. ..................................... 364/492; 361/80; 324/52
[58] Field of Search .......................... 364/492; 324/52; 361/80, 81, 79

[56] References Cited

U.S. PATENT DOCUMENTS

| | | | |
|---|---|---|---|
| 3,710,239 | 1/1973 | Nakamura | 324/52 |
| 3,931,502 | 1/1976 | Kojlas | 324/52 X |
| 3,983,377 | 9/1976 | Vitins | 324/52 X |
| 4,063,166 | 12/1977 | Glavitsch et al. | 324/52 |
| 4,107,778 | 8/1978 | Nii et al. | 324/52 X |
| 4,128,805 | 12/1978 | Lanz | 324/52 |
| 4,148,087 | 4/1979 | Phadke | 324/52 X |

Primary Examiner—Edward J. Wise
Attorney, Agent, or Firm—Frishauf, Holtz, Goodman & Woodward

[57] ABSTRACT

At an end (11) of a power transmission line (10), a fault detecting system monitors variations resulting from a fault in voltage and current being transmitted through the line and calculates the distance between the end and location (20) of the fault by the use of the variations and a line constant inherent to the line, such as that given by the characteristic impedance and the propagation constant, to thereby locate the fault with a sufficient accuracy by directly using the commercial frequency and without affected by the impedance that accompanies the fault. The system can calculate the fault impedance from the distance and those backward impedances seen at the end and an opposing end (12) of the line backwardly of the location of fault.

3 Claims, 7 Drawing Figures

FAULT DETECTING SYSTEM FOR LOCATING A FAULT POINT WITH A FAULT RESISTANCE SEPARATELY MEASURED

BACKGROUND OF THE INVENTION

This invention relates to a system for detecting a fault in a power transmission line having a pair of ends, such as a power station and a substation.

A fault location system is well-known which calculates a distance between either one of the ends of the transmission line and a point of occurrence of the fault. In a conventional fault locating system, use is made of surges which are inevitably developed at the fault point when the fault takes place. The surges are received at both of the ends. From a time difference between the respective instants of reception, the distance is calculated. Another conventional fault locating system supplies, no occurrence of the fault, a sequence of pulses from a particular one of the ends to the transmission line and receives pulses reflected back from the fault point. In this system, a time interval is measured between a time instant when the pulses are generated at the particular end and another time instant when the reflected pulses are received thereat in order to calculate the distance. Thus, the distance is calculated in the conventional systems by the use of the surges and the pulses. The surges and the pulses are susceptible to deformation and attenuation during propagation through the transmission line. Moreover, the surges and the reflected pulses are considerably varied in their waveforms according to aspects of the faults. Therefore, it is difficult with the conventional fault locating systems to precisely detect the fault point.

By the way, it is possible for maintenance to divide a transmission line into a plurality of sections and to resort to a distance relay system comprising a distance relay at one end of the transmission line. With the distance relay, a fault is located in one of the sections by the use of voltages and currents measured directly at the commercial frequency. It is, however, impossible with this system to precisely calculate a distance between the fault point and the end. This is because the calculation is adversely affected by a fault resistance which inevitably appears at the fault point. In addition, it is impossible to calculate the fault resistance. Therefore, it is difficult with this system to analyze aspects and causes of the fault.

SUMMARY OF THE INVENTION

It is an object of this invention to provide a fault detecting system which is capable of precisely locating a fault point in a power transmission line.

It is another object of this invention to provide a fault detecting system of the type described which is not subjected to influence of a fault point resistance.

It is still another object of this invention to provide a fault detecting system which is capable of calculating the fault point resistance.

A fault detecting system to which this invention is applicable is for detecting a fault in a transmission line having a pair of ends by calculating a distance between a predetermined one of the ends and a point of occurrence of the fault to produce a distance signal representative of the distance. The transmission line is for transmitting electric power of a voltage and a current and has a line constant inherent thereto. Each of the voltage and the current has a reference value that is substantially constant unless the fault occurs. According to this invention, the fault detecting system comprises sampling means to be coupled to the transmission line at the predetermined end for sampling, at a preselected sampling interval, the voltage and the current at the predetermined end into successive voltage and current samples, first calculating means responsive to a predetermined number of the successive voltage and current samples for calculating, at each of predetermined calculation instants, a first and a second vector quantity representative of the reference value of the voltage at the predetermined end and that of the current thereat, respectively, to produce a first and a second vector signal representative of the first and the second vector quantities calculated at each calculation instant, respectively, first memory means for memorizing the first and the second vector signals successively produced by the first calculating means with reference to the respective instants at which the first and the second vector quantities represented by the memorized first and the second vector signals are calculated, monitoring means for monitoring the memorized first and second vector signals to produce a fault occurrence signal upon occurrence of the fault, second memory means for memorizing a line constant signal representative of the line constant, and second calculating means responsive to the fault occurrence signal, the memorized first and second vector signals, and the line constant signal for calculating the distance to produce the distance signal.

DESCRIPTION OF THE PREFERRED EMBODIMENTS

Figure 1:
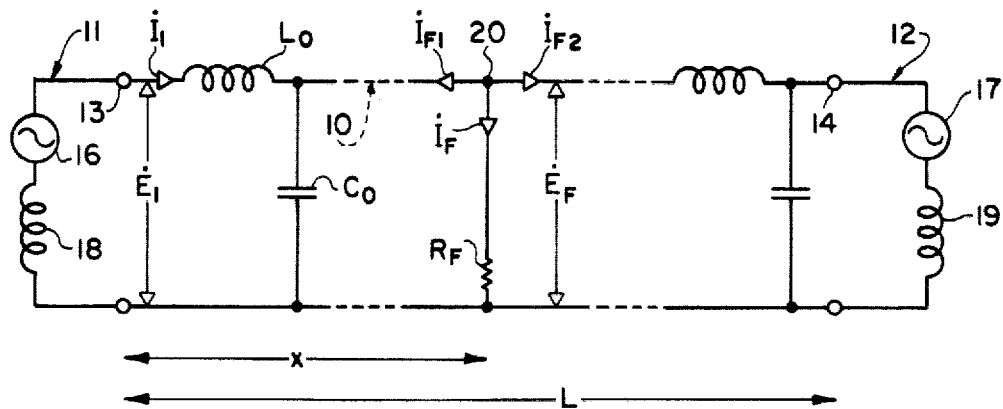
FIG. 1 shows an equivalent circuit of a transmission line after occurrence of a fault.
Figure 2:
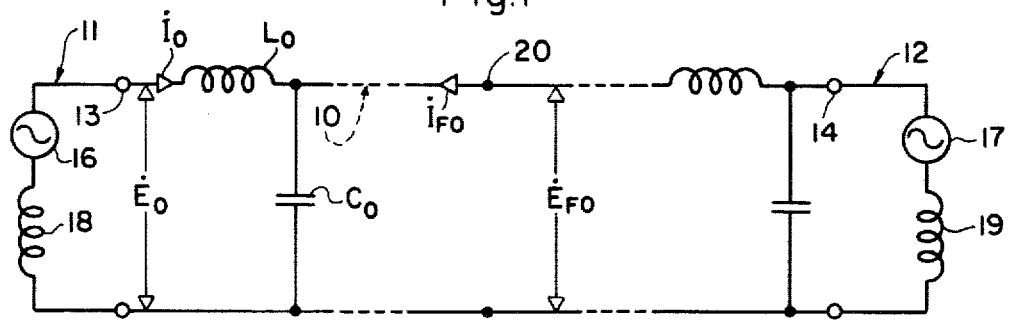
FIG. 2 shows an equivalent circuit of the transmission line prior to occurrence of the fault.
Figure 3:
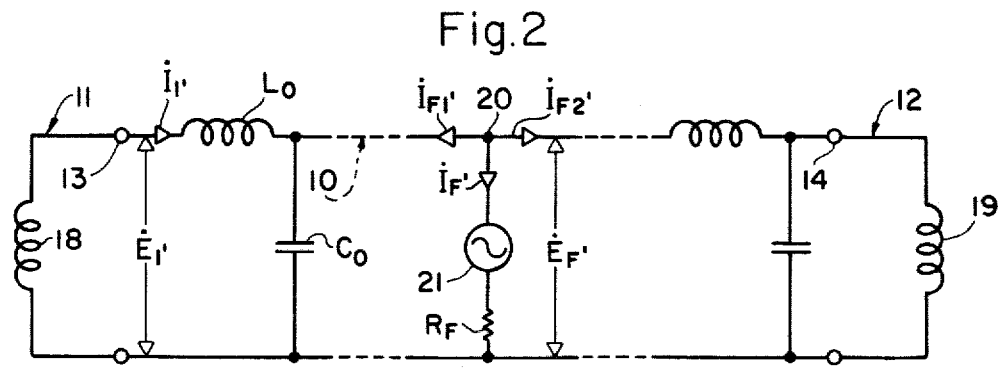
FIG. 3 shows an equivalent circuit of the transmission line with only those variations depicted which result from the fault.

Referring to FIGS. 1 through 3, the mathematical principles on which this invention is based will be described at first for a better understanding of this invention. In these figures, a transmission line 10 comprising a pair of conductors for a single-phase electric power is equivalently depicted as a distributed-constant circuit. It should be noted here that this invention is readily applicable to a transmission line for a three-phase or a multiphase power. The power of each phase is of the commercial frequency and is given by a voltage, a current, and a phase difference therebetween. The transmission line 10 has first and second ends 11 and 12 symbolized in FIGS. 1 and 2 by first and second terminal pairs 13 and 14, first and second electromotive force generators 16 and 17, and first and second inductances 18 and 19. In FIG. 3, the first and the second ends 11 and 12 are symbolized by the first and the second terminal pairs 13 and 14 accompanied by only the first and the second inductances 18 and 19 for the reason that will become clear as the description proceeds. Each of the first and the second ends 11 and 12 may be a power station, a substation, or the like. It is surmised in these figures that a fault has occurred or appeared at a point 20 of the transmission line 10 between the first and the second ends 11 and 12. Let the lengths or distances between the first and the second ends 11 and 12 and between the first end 11 and the fault point 20 be a total length L and a distance x, respectively.

Under the circumstances, it is readily understood that a first and a second four terminal network are formed between the first terminal pair 13 and the fault point 20 and between the fault point 20 and the second terminal pair 14, respectively. Description will be mainly made of the first four terminal network because the second terminal network is substantially equivalent to the first four terminal network.

It may be mentioned here that circuits illustrated in FIGS. 1 and 2, are respresentative of the states in which the transmission line 10 is put after and prior to occurrence or appearance of the fault, respectively, while a circuit illustrated in FIG. 3, the transmission line 10 with only those components thereof which have varied as a result of occurrence of the fault. According to the law of superposition, it is possible to represent the circuit depicted in FIG. 1 by the superposition on each other of the circuits shown in FIGS. 2 and 3. This is helpful to introduction of the formulae described later.

Specifically referring to FIG. 1, the first four terminal network is specified by four-terminal constants $\dot{A}(x)$, $\dot{B}(x)$, $\dot{C}(x)$, and $\dot{D}(x)$, each of which is a function of the distance x. These four-terminal constants are given by a matrix equation:

$$\begin{pmatrix} \dot{A}(x) & \dot{B}(x) \\ \dot{C}(x) & \dot{D}(x) \end{pmatrix} = \begin{pmatrix} \cosh\mu x & \dot{Z}_0 \sinh\mu x \\ (1/\dot{Z}_0)\sinh\mu x & \cosh\mu x \end{pmatrix}, \quad (1)$$

where $\dot{\mu}$ represents a propagation constant of the transmission line 10; and $\dot{Z}_O$, a characteristic or surge impedance thereof. As are well-known in the art, the propagation constant $\dot{\mu}$ and the characteristic impedance $\dot{Z}_O$ are given by:

$$\dot{\mu} = \sqrt{(j\omega L_O + R_O)(j\omega C_O + G_O)} \quad (2)$$

and $$\dot{Z}_O = \sqrt{(j\omega L_O + R_O)/(j\omega C_O + G_O)}, \quad (3)$$

where $L_O$ represents a line inductance per unit length of the transmission line 10; $R_O$, a line resistance per unit length; $C_O$, a line capacitance per unit length; $G_O$, a line conductance per unit length; and $\omega$, an angular frequency that may not necessarily be of the commercial frequency. By the use of Equation (1), a voltage $\dot{E}_F$ developed at the fault point 20 and a current $\dot{I}_{F1}$ caused to flow in a first direction or sense from the fault point 20 to the first end 11 when the fault has occurred are given by:

$$\begin{pmatrix} \dot{E}_F \\ \dot{I}_{F1} \end{pmatrix} = \begin{pmatrix} \dot{A}(x) & -\dot{B}(x) \\ \dot{C}(x) & -\dot{D}(x) \end{pmatrix} \begin{pmatrix} \dot{E}_1 \\ \dot{I}_1 \end{pmatrix}. \quad (4)$$

where $\dot{E}_1$ represents a voltage measured at the first end 11 after or posterior to occurrence of the fault; and $\dot{I}_1$, a current caused to flow in a second direction or sense from the first end 11 to the second end 12 or the fault point 20. The voltage $\dot{E}_1$ and the current $\dot{I}_1$ may be named a first and a second posterior vector quantity, respectively.

Comparing FIG. 2 with FIG. 1, it will be found that a fault resistance or impedance $R_F$(FIG. 1) accompanying the fault point 20 is removed so as to illustrate the transmission line 10 in a normal state prior to occurrence of the fault. A voltage $\dot{E}_{FO}$ developed at the fault point 20 in the normal state and a current $\dot{I}_{FO}$ caused to flow in the direction from the point 20 to the first end 11 are given by:

$$\begin{pmatrix} \dot{E}_{FO} \\ \dot{I}_{FO} \end{pmatrix} = \begin{pmatrix} \dot{A}(x) & -\dot{B}(x) \\ \dot{C}(x) & -\dot{D}(x) \end{pmatrix} \begin{pmatrix} \dot{E}_0 \\ \dot{I}_0 \end{pmatrix}, \quad (5)$$

where $\dot{E}_O$ represents a voltage of the first end 11 prior to or anterior to occurrence of the fault; and $\dot{I}_O$, a current caused to flow in the second direction from the first end 11 to the point 20 in the normal state prior to occurrence of the fault. The voltage $\dot{E}_O$ and the current $\dot{I}_O$ may be referred as a first and a second anterior vector quantity, respectively.

Comparing FIG. 3 with FIGS. 1 and 2, the fault resistance $R_F$ and another generator 21 are shown at the fault point 20. A fault current $\dot{I}_F'$ flowing through the fault resistance $R_F$ so that:

$$\dot{I}_F' = -(\dot{I}_{F1} + \dot{I}_{F2}), \quad (6)$$

is divided into first and second fault currents $\dot{I}_{F1}'$ and $\dot{I}_{F2}'$ directed to the first and the second ends 11 and 12, respectively. From FIGS. 1 and 3, the current $\dot{I}_F'$ is inversely directed to the first and the second fault currents $\dot{I}_{F1}'$ and $\dot{I}_{F2}'$ and is:

$$\dot{I}_F' = \dot{I}_F. \quad (7)$$

When a voltage at the fault point 20 in FIG. 3 is denoted by $\dot{E}_F'$, the voltage $\dot{E}_F'$ and the first fault current $\dot{I}_{F1}'$ are given by:

$$\begin{pmatrix} \dot{E}_F' \\ \dot{I}_{F1}' \end{pmatrix} = \begin{pmatrix} \dot{A}(x) & -\dot{B}(x) \\ \dot{C}(x) & -\dot{D}(x) \end{pmatrix} \begin{pmatrix} \dot{E}_1' \\ \dot{I}_1' \end{pmatrix}. \quad (8)$$

where $\dot{E}_1'$ represents that variation in the voltage $\dot{E}_1$ (FIG. 1) at first end 11 which results from occurrence of the fault; and $\dot{I}_1'$, a similar variation in the current $\dot{I}_1$ at the first end 11. According to the law of superposition, the voltage and the current $\dot{E}_1$ and $\dot{I}_1$ at the first end 11 and the voltage $\dot{E}_F$ at the fault point 20 are given by:

$$\dot{E}_1 = \dot{E}_0 + \dot{E}_1', \quad (9)$$

$$\dot{I}_1 = \dot{I}_0 + \dot{I}_1', \quad (10)$$

and $$\dot{E}_F = \dot{E}_{FO} + \dot{E}_F', \quad (11)$$

where $$\dot{E}_F = \dot{I}_F R_F. \tag{12}$$

Now, let first and second impedances be $\dot{Z}_{F1}'$ and $\dot{Z}_{F2}'$ when the first and the second ends 11 and 12 are seen at the fault point 20, respectively. The first and the second impedances $\dot{Z}_{F1}'$ and $\dot{Z}_{F2}'$ are:

$$\dot{Z}_{F1}' = [\dot{Z}_A + \dot{Z}_1] \tag{13}$$

and $$\dot{Z}_{F2}' = [\dot{Z}_B + \dot{Z}_2]. \tag{14}$$

where $\dot{Z}_A$ and $\dot{Z}_B$ represent line impedances between the first end 11 and the fault point 20 and between the fault point 20 and the second end 12, respectively; and $\dot{Z}_1$ and $\dot{Z}_2$, a first and a second backward impedance when the transmission line 10 is seen at the first and the second ends 11 and 12 backwardly relative to the fault point 20. It is possible to calculate the line impedances $\dot{Z}_A$ and $\dot{Z}_B$ with reference to the total length L of the transmission line 10 and the distance x. As will later become clear, a ratio K(x) of the first impedance $\dot{Z}_{F1}'$ to the second impedance $\dot{Z}_{F2}'$ is approximately given by a real number as a function of x and is equal to a ratio of the second fault current $\dot{I}_{F2}'$ to the first fault current $\dot{I}_{F1}'$. By the use of the ratio K(x), Equation (12) is rewritten into:

$$\dot{I}_F = -[1 + K(x)] \cdot \dot{I}_{F1}' \tag{15}$$

The voltages $\dot{E}_1$ and $\dot{E}_O$ and the currents $\dot{I}_1$ and $\dot{I}_0$ in Equations (9) and (10) are measurable at the first end 11. Line constants such as the propagation constant $\mu$ and the characteristic impedance $\dot{Z}_0$ are inherent to the transmission line 10. In addition, the first and the second backward impedances $\dot{Z}_1$ and $\dot{Z}_2$ are also measurable or predetermined at the respective ends although such impedances $\dot{Z}_1$ and $\dot{Z}_2$ used in Equations (13) and (14) are dependent on the generator, the transformer, and/or the loads (not shown) connected to the first and the second ends 11 and 12. In order to calculate the distance x between the first end 11 and the fault point 20, the distance x will be related hereinafter to the voltages $\dot{E}_1$, $\dot{E}_0$, the currents $\dot{I}_1$, $\dot{I}_0$, and the line constants.

From Equation (4), the voltage $\dot{E}_F$ of the fault point 20 after occurrence of the fault is given by:

$$\dot{E}_F = \dot{A}(x)\dot{E}_1 - \dot{B}(x)\dot{I}_1. \tag{16}$$

With Equations (12) and (15), Equation (16) is rewritten into:

$$\dot{E}_F = \dot{I}_F R_F = -[1+K(x)]\dot{I}_{F1}' R_F. \tag{17}$$

From Equation (8), the current $\dot{I}_{F1}'$ is:

$$\dot{I}_{F1}' = \dot{C}(x)\dot{E}_1' - \dot{D}(x)\dot{I}_1'. \tag{18}$$

By the use of Equations (9) and (10), Equation (18) is rewritten into:

$$\dot{I}_{F1}' = \dot{C}(x)(\dot{E}_1 - \dot{E}_0) - \dot{D}(x)(\dot{I}_1 - \dot{I}_0). \tag{19}$$

Substituting Equation (19) into Equation (17):

$$\dot{E}_F = -[1+K(x)]R_F \times [\dot{C}(x)(\dot{E}_1 - \dot{E}_0) - \dot{D}(x)(\dot{I}_1 - \dot{I}_0)] \tag{20}$$

Division of Equation (20) by Equation (19) side by side gives:

$$\begin{aligned}\dot{E}_F/\dot{I}_{F1}' &= -[1 + K(x)]R_F \\ &= [\dot{A}(x)\dot{E}_1 - \dot{B}(x)\dot{I}_1]/[\dot{C}(x)(\dot{E}_1 - \dot{E}_0) - \\ &\quad \dot{D}(x)(\dot{I}_1 - \dot{I}_0)]\end{aligned} \tag{21}$$

It is often pointed out in the art that an impedance and an admittance of the transmission line 10 are mainly dependent on or dominated by inductance and capacitance components while resistance and conductance components may be practically negligible as compared with the impedance and the admittance components. In a recent power transmission system, reactance components are dominant factors of the backward impedances $\dot{Z}_1$ and $\dot{Z}_2$ rather than resistance components are. In other words, the backward impedances $\dot{Z}_1$ and $\dot{Z}_2$ may be considered to be the reactance components alone. These facts enable the first and the second impedances $\dot{Z}_{F1}'$ and $\dot{Z}_{F2}'$ of Equations (13) and (14) to be approximated by the reactance components alone. Stated otherwise, the impedances $\dot{Z}_{F1}'$ and $\dot{Z}_{F2}'$ have scarcely any phase difference therebetween. Consequently, the ratio K(x) is represented only by a real part without an imaginary part. Incidentally, the fault resistance $R_F$ may be regarded as a pure resistance because it is usually an arc resistance.

From the above, it is readily understood that the right hand side of Equation (21) is represented by a real number alone because both of the factor $[1+K(x)]$ and the resistance $R_F$ are represented by real numbers. Based on the above assumption, Equation (21) will be solved as regards the distance x. For this purpose, each of the respective voltages and currents $\dot{E}_F$, $\dot{I}_{F1}'$, $\dot{E}_1$, $\dot{I}_1$, $\dot{E}_0$, and $\dot{I}_0$ of vector quantities is denoted as a complex number by:

$$\left.\begin{aligned}\dot{E}_F &= E_{Fr} + jE_{Fi} \\ \dot{I}_{F1}' &= I_{F1r}' + jI_{F1i}' \\ \dot{E}_1 &= E_r + jE_i \\ \dot{I}_1 &= I_r + jI_i \\ \dot{E}_0 &= E_{0r} + jE_{0i} \\ \text{and } \dot{I}_0 &= I_{0r} + jI_{0i}\end{aligned}\right\} \tag{22}$$

where j represents the imaginary unit. Inasmuch as the resistance and the conductance components of the line constants are substantially negligible as mentioned before, the propagation constant $\mu$ and the characteristic impedance $\dot{Z}_O$ of Equations (2) and (3) are simplified into:

$$\mu \approx \omega\sqrt{L_O C_O}$$

and $$\dot{Z}_O \approx \omega\sqrt{L_O/C_O}.$$

As a result, the four terminal constants $\dot{A}(x)$, $\dot{B}(x)$, $\dot{C}(x)$, and $\dot{D}(x)$ are rewritten into:

$$\left.\begin{array}{l} \dot{A}(x) = \cos\mu x \\ \dot{B}(x) = jZ_0\sin\mu x, \\ \dot{C}(x) = j(1/Z_0)\sin\mu x, \\ \text{and} \quad \dot{D}(x) = \cos\mu x. \end{array}\right\} \quad (23)$$

Substitution of Equations (22) and (23) for Equations (19) and (21) gives:

$$\dot{E}_F = E_{Fr} + jE_{Fi}$$
$$= (E_r\cos\mu x + Z_0I_i\sin\mu x) + j(E_i\cos\mu x - Z_0I_r\sin\mu x) \quad (24)$$

$$\dot{I}_{Fl}' = I_{Fl r}' + jI_{Fl i}'$$
$$= [((E_{0i} - E_i)/Z_0)\sin\mu x - (I_r - I_{0r})\cos\mu x]$$
$$+ j[((E_r - E_{0r})/Z_0)\sin\mu x - (I_i - I_{0i})\cos\mu x] \quad (25)$$

As mentioned hereinabove, the imaginary part of Equation (21) is substantially zero. The relationship between the real and the imaginary parts of Equations (24) and (25) is therefore defined by:

$$\dot{E}_{Fi}\dot{I}_{Flr}' - \dot{E}_{Fr}\dot{I}_{Fli}' = 0. \quad (26)$$

Substitution of Equations (24) and (25) for Equation (26) gives:

$$(\beta Z_0 - \alpha/Z_0)\sin\mu x\cdot\cos\mu x + \gamma\cos^2\mu x + \gamma\sin^2\mu x = 0, \quad (27)$$

where $\alpha, \beta, \gamma$, and $\delta$ are representative of four variables represented by:

$$\left.\begin{array}{l} \alpha = E_r(E_r - E_{0r}) + E_i(E_i - E_{0i}), \\ \beta = I_r(I_r - I_{0r}) + I_i(I_i - I_{0i}), \\ \gamma = E_r(I_i - I_{0i}) - E_i(I_r - I_{0r}), \\ \text{and} \quad \delta = I_r(E_i - E_{0i}) - I_i(E_r - E_{0r}). \end{array}\right\} \quad (28)$$

Equation (27) is further rewritten into:

$$(Z_0\beta - \alpha/Z_0)\sin 2\mu x - (\delta - \gamma)\cos 2\mu x + (\gamma + \delta) = 0. \quad (29)$$

From Equation (28), the distance x is given by:

$$x = (\tan^{-1}[(\delta - \gamma)/(\beta Z_0 - \alpha/Z_0)] - \sin^{-1}[\gamma + \delta)/([\beta Z_0 - \alpha/Z_0]^2 + [\delta - \gamma]^2)^{\frac{1}{2}}]) \div 2\mu. \quad (30)$$

For convenience of description, a set of four Equations (28) and the single Equation (30) will be referred to as first formulae and a second formula, respectively. It will be readily found that the second formula (30) is exempted from the fault resistance $R_F$ and also from the ratio $K(x)$ which is the function of x. This means that the distance x is calculable by the use of the second formula (30) irrespective of the fault resistance $R_F$ and the ratio $K(x)$.

It is readily understood that a factor $-[1+K(x)]$ that appears in Equation (15) is calculated by substitution of the above calculated distance x for Equation (21). With Equations (13) and (14), the ratio $K(x)$ is calculated when the distance x and the first and the second backward impedances $\dot{Z}_1$ and $\dot{Z}_2$ are known in advance. Therefore, the fault resistance $R_F$ is given by:

$$R_F = -[E_r\cos\mu x + Z_0I_i\sin\mu x + j(E_i\cos\mu x - Z_0I_r\sin\mu x)]$$
$$\div [(1 + K(x)]$$

$$\times [((E_{0i} - E_i)/Z_0)\sin\mu x - (I_r - I_{0r})\cos\mu x + j[(E_r - E_{0r})/Z_0]\sin\mu x - [I_i - I_{0i}]\cos\mu x)]. \quad (31)$$

The fault resistance $R_F$ is useful in analyzing the aspects and causes of the fault.

It is possible to directly calculate the distance x by the use of Equation (27) in accordance with a pertinent approximate calculation method, for example, the Newton-Raphson method. For application of the Newton-Raphson method, let the lefthand side of Equation (27) be a function $F(x)$. A provisional spacing $x_O$ is predetermined as an initial value for the distance x between the first and the second ends 11 and 12, namely, between zero and the total length L. When the provisional spacing $x_O$ is not in registration with a true fault point, the function $F(x)$ is not equal to zero. To make the function $F(x)$ converge into zero, a recurrence formula is defined by:

$$x_n = x_{n-1} - F(x_{n-1})/F'(x_{n-1}), \quad (32)$$

where $x_n$ ($n = 1, 2, 3, \ldots$) represent a sequence of resulting spacings successively calculated by the formula (32); and $F'(x)$, a derivative $dF(x)/(dx)$. According to the recurrence formula (32), it is well-known in the art that each of the resulting spacings $x_n$ approaches the true fault point, as compared with the prior resulting spacing $x_{n-1}$. The recurrence formula (32) is repeatedly calculated until the difference between the prior spacing $x_{n-1}$ and the resulting spacing $x_n$ in question becomes shorter than a predetermined threshold length or tolerance. When the difference is within the tolerance, the resulting spacing $x_n$ may be considered to be approximately equal to the true fault distance x. The fault resistance $R_F$ is also calculated with reference to the calculated distance in the aforementioned manner by the use of Equation (30).

Figure 4:
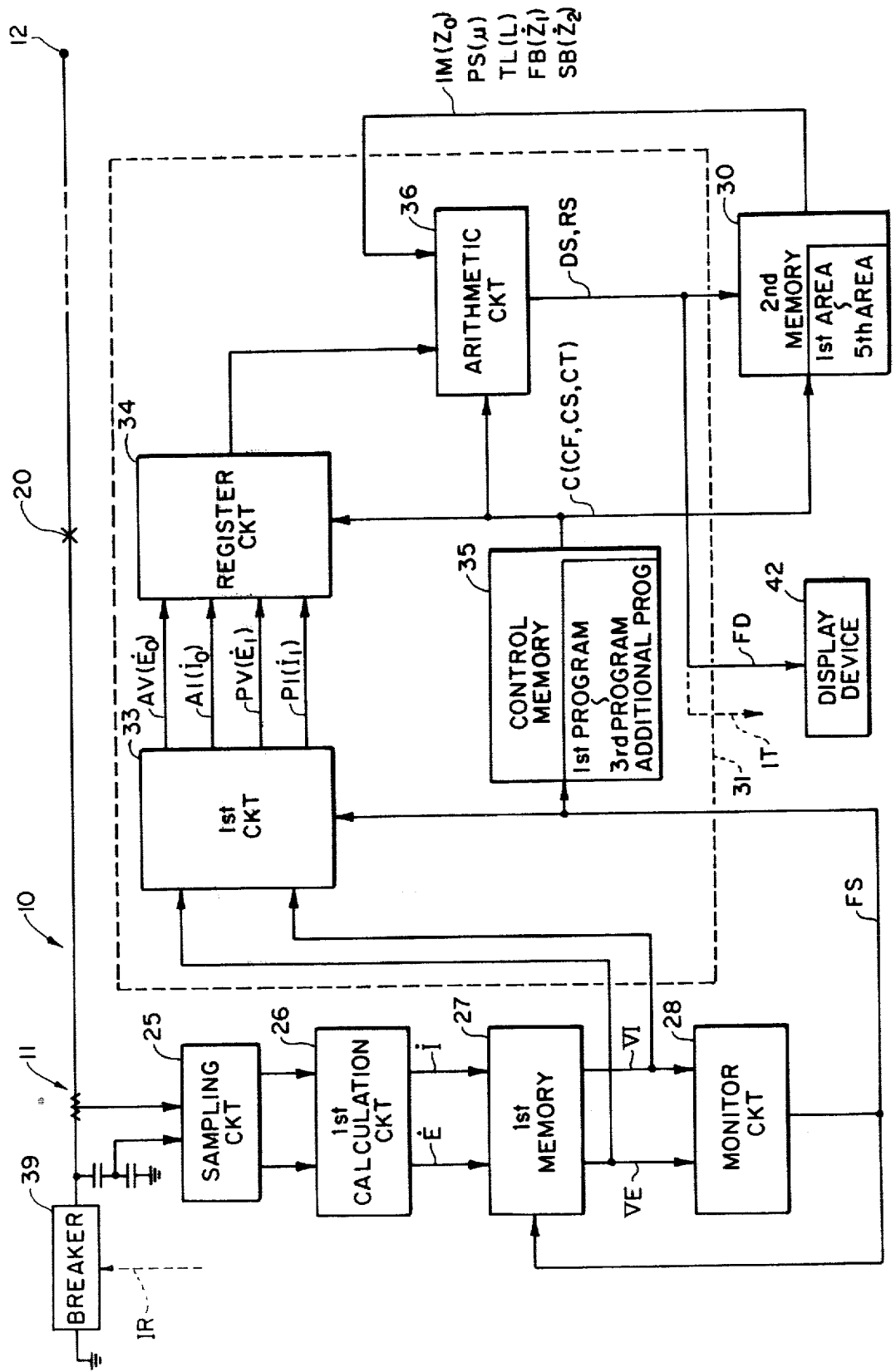
FIG. 4 is a block diagram of a fault detecting system according to a first embodiment of this invention.
Figure 5:
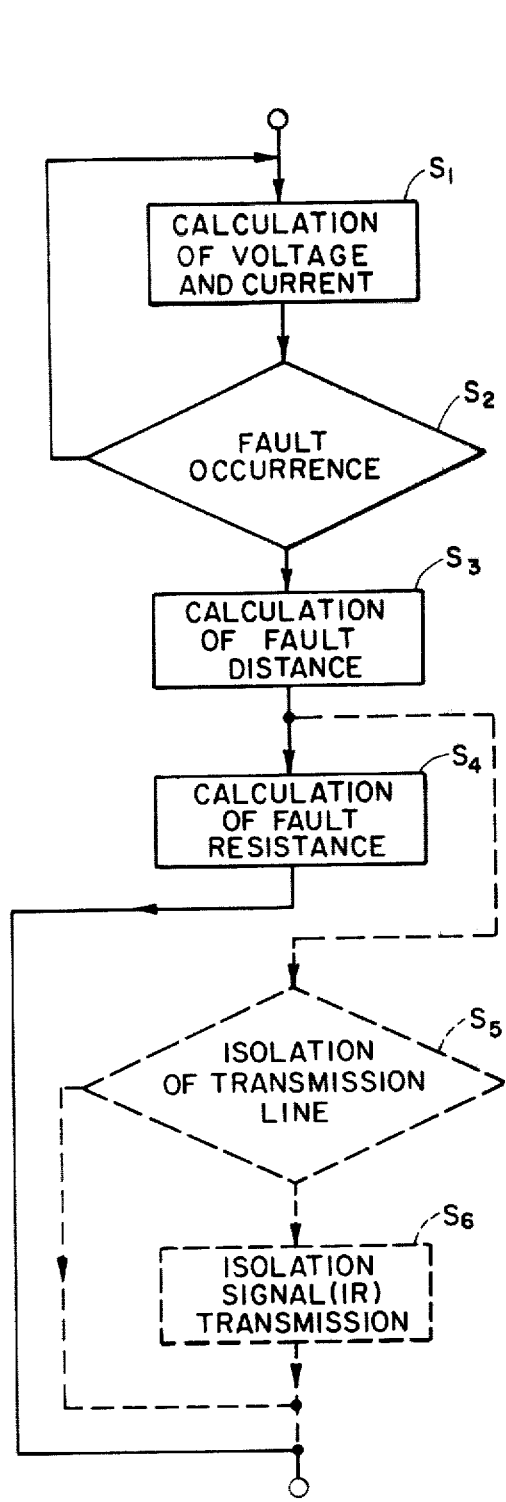
FIG. 5 is a flow chart for generally describing the operation of the fault detecting system according to the first embodiment.

Referring now to FIGS. 4 and 5, a fault detecting system according to a first embodiment of this invention is for calculating the distance x and the fault resistance $R_F$ in accordance with Equations (30) and (31), respectively. Similar parts and constants are designated by like reference symbols as in FIGS. 1 through 3. The transmission line 10 has a line constant inherent thereto, such as a set of a propagation constant $\mu$ and a characteristic impedance $Z_O$, and is for transmitting electric power of the commercial frequency. Each of the voltage and the current of the power has a reference value, such as an effective value of a peak-to-peak value, which is substantially constant unless the fault occurs. The illustrated fault detecting system comprises a sampling circuit 25 to be coupled to the transmission line 10 at the first end 11. By the sampling circuit 25, each of the voltage and the current is sampled at a preselected interval, for example, 5 milliseconds, into a succession of voltage and current samples. Responsive to the succession of the voltage and current samples, a first calculation circuit 26 calculates a first and a second vector quantity representative of the reference value of the voltage and that of the current, respectively, as shown in a first stage $S_1$ (FIG. 5). Practically, the first calculation circuit 26 calculates the first and the second quantities at each of predetermined calculation instants spaced a predetermined interval of, for example, 20 milliseconds. Between consecutive ones of the calculation instants, a predetermined number of each of the successive voltage and the current samples are supplied to the first calculation circuit 26. The first calculation circuit 26 may be an arithmetic unit of a computer and produces a first and a second vector signal $\dot{E}$ and $\dot{I}$ representative of the first and the second vector quantities, respectively, at each of the calculation instants. Use is possible, as the first calculation circuit 26, of the system disclosed in U.S. Pat. No. 4,075,697 issued to Tomoyoshi Ochiai et al, assigned to the same assignee as the present application. The first and the second vector signals E and I are successively supplied in a pair to a first or data memory 27. The data memory 27 memorizes a prescribed number of each of the first and the second vector signals $\dot{E}$ and $\dot{I}$ with reference to the calculation instants to successively produce, as a pair of first and second memorized signals VE and VI, the first and second memorized vector signal pair $\dot{E}$ and $\dot{I}$, respectively, at each of the calculation instants. The predetermined number should be at least two. It is possible to refer to the calculation instants by using the instants in accessing the memory 27. The data memory 27 may be a shift register circuit comprising a plurality of stages for each of the first and the second vector signals $\dot{E}$ and $\dot{I}$.

Successively supplied with the first and the second memorized signals VE and VI in pairs, a monitor circuit 28 depicted in FIG. 4 monitors variations of the first and the second vector quantities represented by the first and the second memorized signals VE and VI. This process is designated by a second stage $S_2$ (FIG. 5). The monitor circuit 28 continues to monitor the first and the second vector quantities as long as the fault does not occur in the transmission line, as readily understood from the first and the second stages $S_1$ and $S_2$. When the fault occurs, the monitoring circuit 28 produces a fault occurrence signal FS indicative of occurrence of the fault. The fault occurrence signal FS is supplied to the first memory 27 to cause it to be interrupted.

The fault detecting system depicted in FIG. 4 further comprises a second memory 30 for the line constant given, in this example, by the characteristic impedance $Z_O$ and the propagation constant $\mu$. The second memory 30 comprises a first area for memorizing a characteristic impedance signal IM representative of the characteristic impedance $Z_O$ and a second area for memorizing a propagation constant signal PC representative of the propagation constant $\mu$. The second memory 30 may be a main memory of the computer, a read-only memory optionally attached to the fault detecting system, or the like.

The fault detecting system further comprises a second calculation circuit 31 connected to the first memory 27, the monitor circuit 28, and the second memory 30. The second calculation circuit 31 may be a central processor of the computer used as the first calculation circuit 26, the first memory 27, and the monitor circuit 28. Briefly, the second calculation circuit 31 is energized by the fault occurrence signal FS on occurrence of the fault and produces a distance signal DS representative of the distance x, as shown by a third stage $S_3$ (FIG. 5) and, thereafter, a resistance signal RS representative of the fault resistance $R_F$, as shown by a fourth stage $S_4$ (FIG. 5).

More particularly, the second calculation circuit 31 comprises a first circuit 33 energized by the fault occurrence signal FS and, thereafter, responsive to the first and the second vector signals VE and VI memorized in the first memory 27. The first and the second memorized signals VE and VI are representative of the respective ones of the first and the second vector quantities calculated at a first of the calculation instants that is prior to or earlier than occurrence of the fault and representative of the respective ones of the first and the second vector quantities calculated at a second of the calculation instants on or after occurrence of the fault. The first circuit 33 produces a first and a second anterior vector signal AV and AI representative of the first and the second vector quantities calculated at the first calculation instant and denoted by $\dot{E}_O$ and $\dot{I}_O$ used in Equation (5), respectively. The first circuit 33 produces a first and a second posterior signal PV and PI representative of the first and the second vector quantities calculated at the second calculation instant and denoted by $\dot{E}_1$ and $\dot{I}_1$ used in Equation (4), respectively. The first circuit 33 may be a gate circuit. The first and the second anterior and posterior signals AV and AI and PV and PI are supplied to a register circuit 34 to be retained therein.

The second calculation circuit 31 further comprises a control memory 35 for memorizing a computer program defining a predetermined calculation to produce a sequence of command signals in response to the fault occurrence signal FS. Specifically, the computer program comprises a first program defining the first formulae (28) and a second program defining the second formula (30). The first program, which consists of a sequence of first commands, is started by the fault occurrence signal FS and is followed by the second program consisting of a sequence of second commands. The control memory 35, therefore, produces a first and a second command signal sequence CF and CS representative of the first and the second command sequences, respectively. As will become clear in the following, the first and the second command signals are delivered as control signals C to those other elements in the second calculation circuit 31 which are to be controlled thereby.

The second calculation circuit 31 further comprises an arithmetic section 36 for executing calculation in response to the first and the second command sequences CF and CS. The arithmetic section 36 may comprise an operation register in addition to an arithmetic unit. Responsive to the first command signals CF, the arithmetic section 36 is initially supplied with the first and the second anterior and posterior signals AV and AI and PV and PI to calculate the four variables $\alpha$, $\beta$, $\gamma$, and $\delta$ according to the first formulae (28). The four variables $\alpha$, $\beta$, $\gamma$, and $\delta$ are stored as four result signals in a pertinent memory circuit which may be either the operation register or the second memory 30. Thereafter, the second program controls the arithmetic section 36.

Under control of the second command signals, the arithmetic section 36 receives the result signals from the pertinent memory, the characteristic impedance signal IM and the propagation constant signal PS from the second memory 30 and calculates an approximate value of the distance x in accordance with the second formula (30) to produce as a distance signal DS the distance x thus calculated. The distance signal DS is supplied to the second memory 30 or a display device 42 like a cathode ray tube. The above-mentioned process is designated by the third stage $S_3$ (FIG. 5).

The third stage $S_3$ may be followed by a fifth stage $S_5$ depicted by a broken line in FIG. 5. The fifth stage $S_5$ is for detecting whether or not the transmission line 10 is to be isolated or cut off with reference to the distance x calculated. For example, when the distance x exceeds the total length L, the transmission line 10 need not be isolated or cut off between the first and the second ends 11 and 12. In other words, the transmission line 10 may be isolated or cut off between the first and the second ends 11 and 12 only when the distance x is less than the total length L. When the isolation is required, the second calculation circuit 31 produces an isolation signal IR requesting the isolation of the transmission line, as shown by a sixth stage $S_6$ (FIG. 5). The isolation signal IR is supplied to a circuit breaker 39 (FIG. 4). The fifth and the sixth stages $S_5$ and $S_6$ may be executed by the use of an additional program memorized in the control memory 35. This shows the fact that this system serves as a protection equipment for the transmission line 10.

Further referring to FIGS. 4 and 5, the fault detecting system enables the fault resistance $R_F$ to be calculated in accordance with Equation (31) after calculation of the distance x, as shown by the fourth stage $S_4$ (FIG. 5). For this purpose, the first and the second backward impedances $\dot{Z}_1$ and $\dot{Z}_2$ should be previously calculated together with the total length L of the transmission line 10. From this fact, the transmission line 10 may be considered to have no other ends other than the first and the second ends 11 and 12. In this example, let the first and the second backward impedances $\dot{Z}_1$ and $\dot{Z}_2$, and the total length L be all memorized in the second memory 30. In other words, the second memory 30 further comprises a third area for memorizing a total length signal TL representative of the total length L, and a fourth and a fifth area for a first and a second backward impedance signals FB and SB representative of the first and the second backward impedances $\dot{Z}_1$ and $\dot{Z}_2$, respectively. For the total length signal TL, the first and the second backward impedance signals FB and SB, another memory may be provided independently of the second memory 30.

In order to calculate the fault resistance $R_F$, a third program defining calculation of Equation (31) is necessary. Therefore, the control memory 35 further comprises a third area for memorizing the third program to produce a sequence of third command signals CT following the second program. The arithmetic section 36 also serves to calculate the fault resistance $R_F$ in response to the third command signals CT. More particularly, the arithmetic section 36 calculates at first the line impedances $\dot{Z}_A$ and $\dot{Z}_B$ with reference to the total length L and the distance x and, thereafter, calculates the impedance ratio K(x) according to Equations (13) and (14) by the use of the memorized distance signal DS, and the first and the second backward resistance signals FB and SB to produce an impedance ratio signal (not shown) representative of the impedance ratio K(x) and retained in the arithmetic section 36. Responsive to the second succession of the third command signals CT, the arithmetic section 36 calculates the fault resistance $R_F$ in accordance with Equation (31) using the impedance signal retained therein, and receives the characteristic impedance signal IM, the propagation constant signal PS, and the first and the second anterior and posterior signals AV and AI and PV and PI delivered thereto. The fault resistance $R_F$ is supplied, as a fault resistance signal FD, to the display device. This process is depicted by the fifth stage $S_5$ in FIG. 5. As mentioned before, the fault resistance $R_F$ serves for analysis of the fault.

Figure 6:
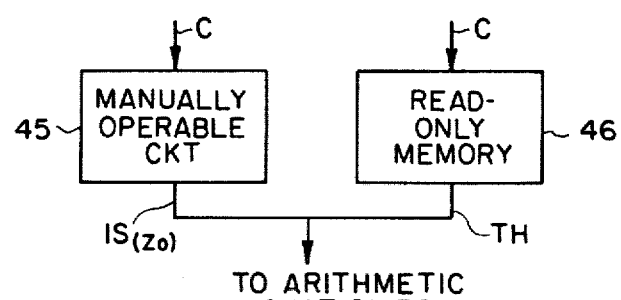
FIG. 6 is a block diagram of a part of a fault detecting system according to a second embodiment of this invention.

Referring to FIG. 4 again and FIG. 6 afresh, a fault detection system according to a second embodiment of this invention is for calculating the distance x according to the Newton-Raphson method mentioned above. In this example, the system comprises a manually operable circuit 45 and a read-only memory 46, in addition to the respective elements illustrated with reference to FIG. 4. It is possible for the manually operable circuit 45 to manually and optionally set an initial or provisional spacing $x_O$ from the first end 11 towards the second end 12 along the transmission line 10. The manually operable circuit 45 produces the initial spacing $x_O$ as an initial spacing signal IS. The read-only memory 46 is for memorizing a threshold signal TH representative of a threshold length described in conjunction with the Newton-Raphson method.

Prior to calculation of the recurrence formula (32), the first formulae (28) should be calculated because the function F(x) includes the four variables $\alpha$, $\beta$, $\gamma$, and $\delta$, as shown in Equation (27). For this purpose, the control memory 35 memorizes a computer program similar to the first program described in conjunction with a system according to the first embodiment to define the first formulae (28) and to produce a sequence of command signals in response to a fault occurrence signal FS delivered from the monitor circuit 28. The control memory 35 further memorizes a first computer program defining the recurrence formula (32) to produce a first series of command signals following the command signal sequence and a second computer program following the first computer program to produce a second series of command signals. The second computer program is for monitoring a difference between two consecutive ones of the resulting spacings $x_n$ with reference to the threshold length or tolerance represented by a threshold length signal TH to make the first computer program start again and to interrupt the calculation of the recurrence formula (32) when the difference is greater than and is equal to or less than the threshold length. In this example, the second computer program is followed by another computer program defining the formula (31) to calculate the fault resistance $R_F$, like the first embodiment.

Figure 7:
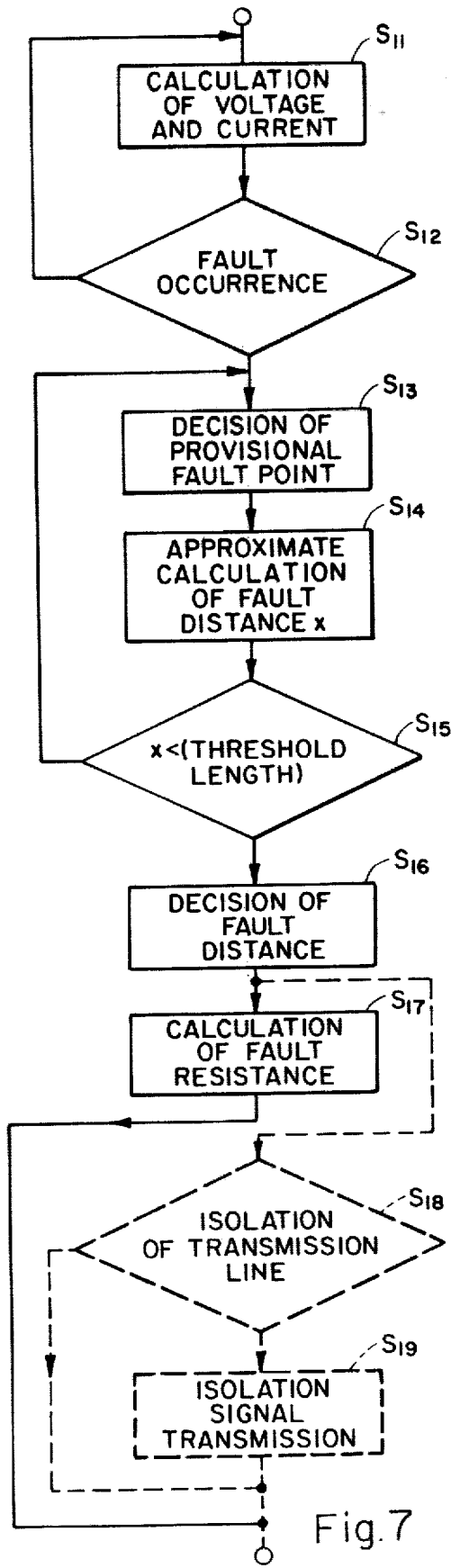
FIG. 7 is a flow chart similar to FIG. 5 for describing the fault detecting system according to the second embodiment.

Further referring to FIG. 7, the monitor circuit 28 produces the fault occurrence signal FS on occurrence of the fault in cooperation with the first calculation circuit 26 and the first memory 27, as shown by first and second stages $S_{11}$ and $S_{12}$. The stages $S_{11}$ and $S_{12}$ are similar to the stages $S_1$ and $S_2$ of FIG. 5, respectively. As is the case with a system according to the first embodiment, the first circuit 33 produces the first and the second anterior and the posterior signals AV and AI and PV and PI in response to the fault occurrence signal FS and the first and the second memorized signals VE and VI. The first and the second anterior and posterior signals are supplied through the retaining circuit 34 to the arithmetic section 36.

The arithmetic section 36 is put into operation in accordance with the control program when supplied with the first and the second anterior and posterior signals. Therefore, the arithmetic section 36 calculates the four variables $\alpha$, $\beta$, $\gamma$, and $\delta$ according to the first formulae (28) in response to the command signal sequence to produce four result signals representative of the respective ones of the four variables thus calculated, as shown by a third stage $S_{13}$ (FIG. 7). The four variables may be stored in either the arithmetic section 36 or the second memory 30. After calculation of the four variables, the arithmetic section 36 calculates in accordance with the recurrence formula (32) under control of the first computer program. More particularly, the arithmetic section 36 is supplied, in accordance with the first series of command signals, with the four result signals, the propagation constant signal PS, the characteristic impedance signal IM, and so forth to produce a resulting spacing signal (not shown) representative of a resulting spacing. The resulting spacing signal may be stored in a pertinent memory circuit, for example, the second memory 30 or an operation register of the arithmetic section 36. This process is depicted by a fourth stage $S_{14}$ in FIG. 7.

Subsequently, the second computer program is read out from the control memory 35 to the arithmetic section 36 to keep the latter under control. Responsive to the second series of command signals, the arithmetic section 36 is supplied with the resulting signal and the threshold signal TH from the read-only memory 46. The arithmetic section 36 produces the distance signal DS as an output signal when the difference becomes shorter than the threshold length. Otherwise, a jump signal of a return to the first computer program, as shown by a fifth stage $S_{15}$ (FIG. 7). This shows the fact that the third through fifth stages $S_{13}$–$S_{15}$ are repeatedly executed until the difference becomes shorter than the threshold length. The distance x is determined from the resulting spacing, as shown by a sixth stages $S_{16}$ in FIG. 7.

As is the case with a system illustrated with reference to FIGS. 4 and 5, the second computer program is followed by another computer program for calculating the fault resistance $R_F$ in accordance with Equation (31), as shown by a seventh stage $S_{17}$ (FIG. 7). On the other hand, the sixth stage $S_{16}$ is followed by an eighth stage $S_{18}$ for detecting whether or not the transmission line 10 is isolated with reference to the distance x. As a result, an isolation signal IR is supplied to the circuit breaker 39, when the transmission line 10 is to be isolated or cut off.

As regards an actual transmission line having a propagation constant $\mu$ of 1.068 (rad/km), a characteristic impedance $Z_O$ of 308.96 (ohms), and a total length L of 44 (km), results of calculation of Equations (30) and (31) according to the embodiment of this invention will be exemplified hereinafter. The transmission line was supplied with a voltage and a current of 50 Hz which had effective value of $115.72-j33.01$ (kV) and $0.75+j1.236$ (kA), respectively, as measured at an end in a normal state. Occurrence of a fault was simulated at a point of 4 (km) spaced from the end with a resistance of 5 (ohms) accompanied thereat. At this time, the voltage remained as in the normal state while the current changed to $18.885-j9.296$ (kA). Under these circumstances, the results calculated by the use of Equations (30) and (31) were 3.98 (km) and 6.20 (ohms), respectively. These results are satisfactory for practical purposes.

While this invention has so far been described in conjunction with a few preferred embodiments thereof, it is readily possible for those skilled in the art to put the invention into practice in various manners. For example, the sampling circuit 25 alone may be placed at the end 11. In this case, the voltage and the current samples are supplied from the sampling circuit 25 through a data transmission medium to the first calculation circuit 26 positioned remote from the end 11. This enables centralized control of the transmission line 10.

What is claimed is:

1. A fault detecting system for detecting a fault in a transmission line having a pair of ends by calculating a distance between a predetermined one of said ends and a point of occurrence of said fault to produce a distance signal representative of said distance, said transmission line being for transmitting electric power of a voltage and a current and having a characteristic impedance and a propagation constant inherent thereto, each of said voltage and said current having a reference value that is substantially constant unless said fault occurs, wherein the improvement comprises:

sampling means (25) to be coupled to said transmission line at said predetermined end for sampling, at a preselected sampling interval, the voltage and the current at said predetermined end into successive voltage and current samples;

calculating means (26) responsive to a predetermined number of the successive voltage and current samples for calculating, at each of predetermined calculation instants, a first and a second vector quantity representative of the reference value of the voltage at said predetermined end and that of the current thereat, respectively, to produce a first and a second vector signal representative of the first and the second vector quantities calculated at said each calculation instant, respectively;

first memory means (27) for memorizing the first and the second vector signals successively produced by said first calculating means with reference to the respective instants at which the first and the second vector quantities represented by the memorized first and the second vector signals are calculated;

monitoring means (28) for monitoring the memorized first and second vector signals to produce a fault occurrence signal upon occurrence of said fault;

second memory means (30) comprising a memory area for memorizing a characteristic impedance signal representative of said characteristic impedance and another memory area for memorizing a propagation constant signal representative of said propagation constant;

first means (33) responsive to said fault occurrence signal and the memorized first and second vector signals for producing a first and a second anterior signal representative of the respective ones of the first and the second vector quantities calculated at a first of said calculation instants that is earlier than occurrence of said fault and a first and a second posterior signal representative of the respective ones of the first and the second vector quantities calculated at a second of said calculation instants that is not earlier than occurrence of said fault; and second means (34–36) responsive to said first and said second anterior signals, said first and said second posterior signals, said characteristic impedance signal, and said propagation constant signal for calculating an approximate value of said distance in accordance with first predetermined formulae and a second predetermined formula following said first predetermined formulae to produce said distance signal;

said first predetermined formulae being defined by:

$$\alpha = E_r(E_r - E_{Or}) + E_i(E_i - E_{Oi}),$$

$$\beta = I_r(I_r - I_{Or}) + I_i(I_i - I_{Oi}),$$

$$\gamma = E_r(I_i - I_{Oi}) - E_i(I_r - I_{Or}),$$

and $$\delta = I_r(E_i - E_{Oi}) - I_i(E_r - E_{Or}),$$

where $\alpha$, $\beta$, $\gamma$, and $\delta$ represent variables and where, when a vector $V$ is represented by $V_r+jV_i$, j being representative of the imaginary unit, $E_{Or}$ and $E_{Oi}$ represent the real and the imaginary parts of the first vector quantity represented by said first anterior signal; $I_{Or}$ and $I_{Oi}$, the real and the imaginary parts of the second vector qnantity represented by the second anterior signal; $E_r$ and $E_i$, the real and the imaginary parts of the first vector quantity represented by said first posterior signal; and $I_r$ and $I_i$, the real and the imaginary parts of the second vector quantity represented by said second posterior signal;

said second formula being:

$$x = (\tan^{-1}[(\delta - \gamma)/(\beta Z_O - \alpha/Z_O)] - \sin^{-1}[(\gamma + \delta)/([\beta Z_O - \alpha/Z_O]^2 + [\delta - \gamma]^2)^{\frac{1}{2}}]) \div (2\mu),$$

where x represents said approximate value; $Z_O$, said characteristic impedance; and $\mu$, said propagation constant.

2. A fault detecting system for detecting a fault in a transmission line having a pair of ends by calculating a distance between a predetermined one of said ends and a point of occurrence of said fault to produce a distance signal representative of said distance, said transmission line being for transmitting electric power of a voltage and a current and having a characteristic impedance and a propagation constant inherent thereto, each of said voltage and said current having a reference value that is substantially constant unless said fault occurs, wherein the improvement comprises:

sampling means (25) to be coupled to said transmission line at said predetermined end for sampling, at a preselected sampling interval, the voltage and the current at said predetermined end into successive voltage and current samples;

calculating means (26) responsive to a predetermined number of the successive voltage and current samples for calculating, at each of predetermined calculation instants, a first and a second vector quantity representative of the reference value of the voltage at said predetermined end and that of the current thereat, respectively, to produce a first and a second vector signal representative of the first and the second vector quantities calculated at said each calculation instant, respectively;

first memory means (27) for memorizing the first and the second vector signals successively produced by said first calculating means with reference to the respective instants at which the first and the second vector quantities represented by the memorized first and the second vector signals are calculated;

monitoring means (28) for monitoring the memorized first and second vector signals to produce a fault occurrence signal upon occurrence of said fault;

second memory means (30) comprising a memory area for memorizing a characteristic impedance signal representative of said characteristic impedance and another memory area for memorizing a propagation constant signal representative of said propagation constant;

first means (33) responsive to said fault occurrence signal and the momorized first and second vector signals for producing a first and a second anterior signal representative of the respective ones of the first and the second vector quantities calculated at a first of said calculation instants that is earlier than occurrence of said fault and a first and a second posterior signal representative of the respective ones of the first and the second vector quantities calculated at a second of said calculation instants that is not earlier than occurrence of said fault;

manually operable means (45-FIG. 6) for producing a spacing signal representative of a preselected spacing in said transmission line from said predetermined end towards the other end;

a read-only memory (46-FIG. 6) memorizing a threshold signal representative of a preselected threshold length;

second means (34-36) responsive to said first and said second anterior signals and to said first and said second posterior signals for calculating an approximate value of said distance in accordance with a set of predetermined formulae and a predetermined recurrence formula to produce said distance signal;

said first predetermined formulae being defined by:

$$\alpha = E_r(E_r - E_{Or}) + E_i(E_i - E_{Oi}),$$

$$\beta = I_r(I_r - I_{Or}) + I_i(I_i - I_{Oi}),$$

$$\gamma = E_r(I_i - I_{Oi}) - E_i(I_r - I_{Or}),$$

and $$\delta = I_r(E_i - E_{Oi}) - I_i(E_r - E_{Or}),$$

where $\alpha, \beta$, $\gamma$, and $\delta$ represent variables and where, when a vector $V$ is represented by $V_r+jV_i$, j being representative of the imaginary unit, $E_{Or}$ and $E_{Oi}$ represent the real and the imaginary parts of the first vector quantity represented by said first anterior signal; $I_{Or}$ and $I_{Oi}$, the real and the imaginary parts of the second vector quantity represented by the second anterior signal; $E_r$ and $E_i$, the real and the imaginary parts of the first vector quantity represented by said first posterior signal; and $I_r$ and $I_i$, the real and the imaginary parts of the second vector quantity represented by said second posterior signal;

said recurrence formula being:

$$x_n = x_{n-1} - F(x_{n-1})/F'(x_{n-1}),$$

where $x_n$ (n = 1, 2, 3, . . . ) represent said resulting spacings; $x_O$, said preselected spacing; $F'(x)$, a derivative $dF(x)/(dx)$; and $F(x)$, a function defined by:

$$F(x) = (\beta Z_0 - \alpha/Z_0)\sin\mu x \cdot \cos\mu x + \gamma \cdot \cos^2\mu x + \delta \cdot \sin^2\mu x,$$

where, in turn, x represents said approximate value of said distance; $Z_O$, said characteristic impedance; and $\mu$, said propagation constant.

3. A fault detecting system as claimed in claim 1 or 2, said transmission line having a total length L between said predetermined and said other ends, said transmission line having a first and a second prescribed backward impedance when seen at the respective ones of said predetermined end and the other end backwardly relative to the point of occurrence of said fault, which is for detecting said fault by further calculating a fault impedance accompanying the point of occurrence of said fault to produce a fault impedance signal representative of said fault impedance and further comprises:

third memory means (30) for memorizing said distance signal;

fourth memory means (30) for memorizing a first and a second backward impedance signal representative of said first and said second backward impedances, respectively;

additional memory means (30) for memorizing a total length signal representative of said total length;

third means (34-36) responsive to the memorized distance signal, said first and said second backward impedance signals, said total length signal, said characteristic impedance signal, said propagation constant signal, the first and the second anterior and posterior signals for calculating said fault impedance designated by R in accordance with a prescribed formula with reference to an impedance ratio $K(x)$, said impedance ratio $K(x)$ being a ratio of a sum of the first backward impedance and a line impedance between said predetermined end and said fault point to another sum of the second backward impedance and another line impedance between said fault point and said other end;

said prescribed formula being:

$$R = - [E_r \cos\mu x + Z_0 I_r \sin\mu x + j(E_i \cos\mu x - Z_0 I_i \sin\mu x)]$$
$$\div ([1 + K(x)]$$
$$\times [([E_{0i} - E_i]/Z_0)\sin\mu x - (I_r - I_{0r})\cos\mu x$$
$$+ j([(E_r - E_{0r})/Z_0]\sin\mu x - [I_i - I_{0i}]\cos\mu x)].$$

* * * * *